US012787683B2

United States Patent
Shen et al.

(12) United States Patent

(10) Patent No.: US 12,787,683 B2

(45) Date of Patent: Nov. 3, 2026

(54) WAFER-LEVEL DIE-TRANSFER TOOL AND METHOD

(71) Applicant: Taiwan Semiconductor Manufacturing Company, Ltd., Hsinchu (TW)

(72) Inventors: Shin-Wei Shen, Tainan City (TW); Chi-Hsiang Chen, Taipei City (TW); Yi-Chao Mao, Taoyuan City (TW); Tsung-Fu Tsai, Changhua County (TW); Szu-Wei Lu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 514 days.

(21) Appl. No.: 18/163,394

(22) Filed: Feb. 2, 2023

(65) Prior Publication Data

US 2024/0203764 A1 Jun. 20, 2024

Related U.S. Application Data

(60) Provisional application No. 63/387,704, filed on Dec. 16, 2022.

(51) Int. Cl.

| | |
|---|---|
| ***H10P 72/00*** | (2026.01) |
| ***H10P 54/00*** | (2026.01) |
| ***H10P 72/70*** | (2026.01) |
| ***H10P 72/78*** | (2026.01) |

(52) U.S. Cl.

CPC .......... *H10P 72/0442* (2026.01); *H10P 54/00* (2026.01); *H10P 72/7402* (2026.01); *H10P 72/78* (2026.01)

(58) Field of Classification Search

CPC .......................... H10P 72/0442; H10P 72/7402

See application file for complete search history.

(56) References Cited

U.S. PATENT DOCUMENTS

| | | | | |
|---|---|---|---|---|
| 10,515,853 | B1 * | 12/2019 | Chen | H10D 89/013 |
| 2003/0162313 | A1 * | 8/2003 | Kim | H01L 21/6835 438/33 |

(Continued)

FOREIGN PATENT DOCUMENTS

JP 2012244013 A * 12/2012

OTHER PUBLICATIONS

Machine translation of JP-2012244013-A (Year: 2012).*

*Primary Examiner* — Erik T. K. Peterson

(74) *Attorney, Agent, or Firm* — McClure, Qualey & Rodack, LLP

(57) ABSTRACT

A die-transfer tool includes a source frame stage, a target frame stage, a roller, and a driving mechanism. The source frame stage is configured to secure a first tape. The target frame stage is configured to secure a second tape, wherein the second tape has an adhesive surface facing the source frame stage when the second tape is mounted on the target frame stage. The roller is configured to move laterally over the non-adhesive surface of the second tape opposite the adhesive surface when a plurality of dies is between the first tape and the adhesive surface of the second tape. The driving mechanism is configured to vertically drive the target frame stage to adjust the relative position of the target frame stage above the source frame stage.

20 Claims, 14 Drawing Sheets

(56) References Cited

U.S. PATENT DOCUMENTS

| | | | | |
|---|---|---|---|---|
| 2004/0020040 A1* | 2/2004 | Arneson | G06K 19/07718 | 156/60 |
| 2004/0137699 A1* | 7/2004 | Kurosawa | H01L 21/78 | 438/460 |
| 2005/0153522 A1* | 7/2005 | Hwang | H01L 25/50 | 257/E21.705 |
| 2007/0077731 A1* | 4/2007 | Masuda | B28D 5/0029 | 438/460 |
| 2007/0087279 A1* | 4/2007 | Otsuka | H01L 21/67132 | 430/109.4 |
| 2007/0264832 A1* | 11/2007 | Arita | H01L 21/78 | 438/700 |
| 2008/0128694 A1* | 6/2008 | Arita | H01L 21/78 | 257/E21.599 |
| 2010/0216313 A1* | 8/2010 | Iwai | H01J 37/32623 | 438/758 |
| 2011/0260248 A1* | 10/2011 | Smeys | H01L 23/481 | 257/E21.585 |
| 2012/0247657 A1* | 10/2012 | Yamamoto | H01L 21/67132 | 156/538 |
| 2014/0127880 A1* | 5/2014 | Grivna | H01L 21/67132 | 29/25.01 |
| 2014/0367015 A1* | 12/2014 | Vaupel | H01L 21/67092 | 156/60 |
| 2016/0079112 A1* | 3/2016 | Itonaga | H01L 21/6836 | 156/538 |
| 2017/0200711 A1* | 7/2017 | Uzoh | H01L 24/75 | |
| 2018/0005862 A1* | 1/2018 | Priewasser | H01L 21/304 | |
| 2018/0012788 A1* | 1/2018 | Oka | H01L 21/78 | |
| 2020/0144095 A1* | 5/2020 | Mikami | B23K 26/08 | |
| 2021/0206585 A1* | 7/2021 | Lam | H01L 21/677 | |
| 2023/0268220 A1* | 8/2023 | Sugiura | H01L 21/67132 | 438/464 |

* cited by examiner

WAFER-LEVEL DIE-TRANSFER TOOL AND METHOD

PRIORITY CLAIM AND CROSS-REFERENCE

This application claims the benefit of U.S. Provisional Application No. 63/387,704, filed on Dec. 16, 2022, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

Although existing die-transfer tools (e.g., pick-and-place tools) and methods have generally been adequate for their intended purposes, they have not been entirely satisfactory in all respects. Consequently, it would be desirable to provide a solution for improving the die-transfer technique.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
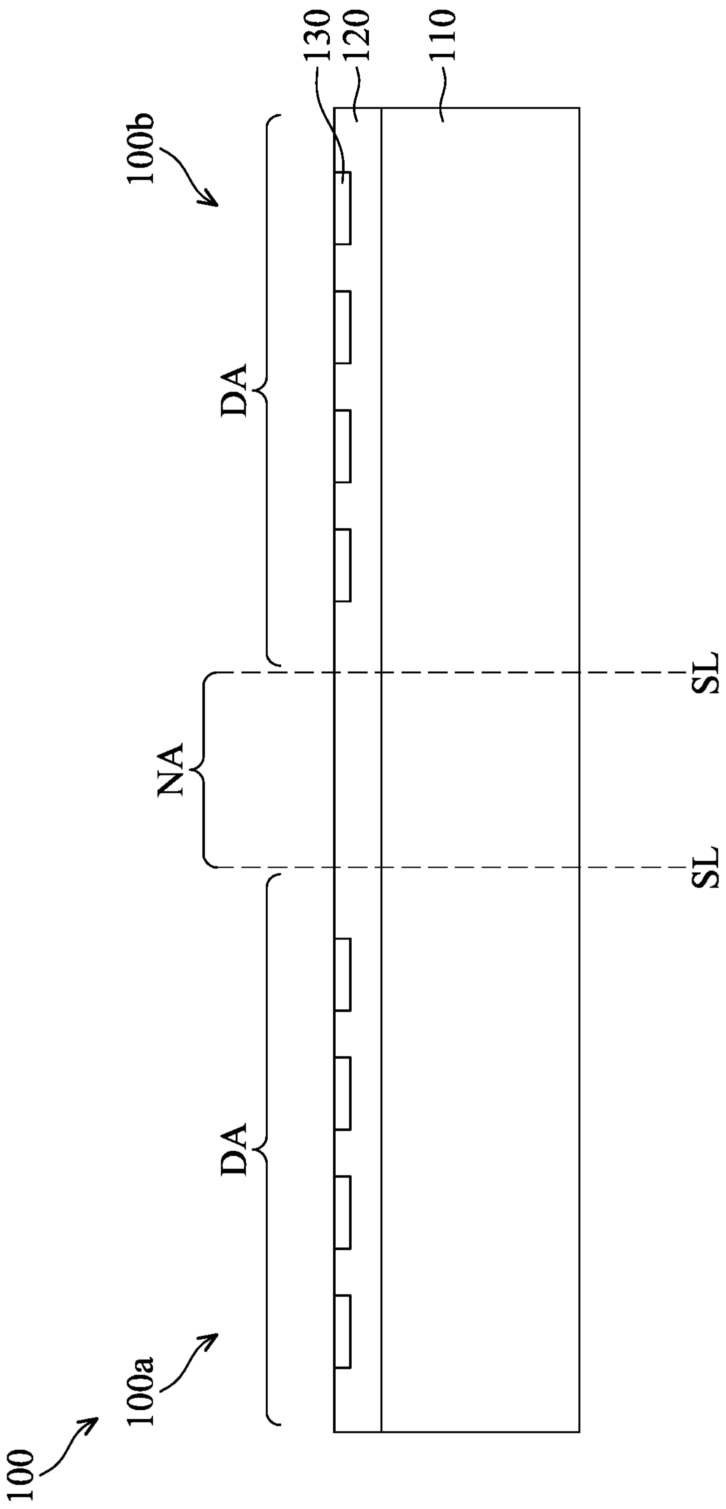
FIGS. 1A to 1D illustrate cross-sectional views of various stages in a singulation process in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The system may be otherwise oriented (rotated 90 degrees or at other orientations) and the spatially relative descriptors used herein may likewise be interpreted accordingly.

Die-transfer tools and methods in accordance with some embodiments of the present disclosure are described. Some variations of the embodiments are also discussed. Throughout the various views and illustrative embodiments, like reference numbers are used to designate like elements.

According to various embodiments, a die-transfer tool is provided, including a source frame stage and a target frame stage disposed over the source frame stage. The source frame stage is used to hold a source frame supporting a first tape, and a processed wafer that includes multiple singulated dies is attached to the first tape. The target frame stage is used to hold a target frame supporting a second tape with the adhesive surface of the second tape facing the source frame stage and the processed wafer thereon. The second tape has greater adhesive strength than the first tape. During operation, the target frame stage is lowered by a driving mechanism to approach the source frame stage. A roller is then used to move laterally over the second tape so that all the dies of the processed wafer on the first tape contact and adhere to the second tape. In the subsequent process, the target frame stage is elevated by the driving mechanism, and when the target frame stage reaches a certain height above the source frame stage, all the dies of the processed wafer are transferred from the first tape to the second tape. Accordingly, the proposed die-transfer tool can transfer wafer-level dies simultaneously, thereby making the transfer of dies more efficient than the other method of using traditional pick-and-place tools that pick and transfer a single die at a time. Some other advantages are explained below.

Embodiments will be described with respect to a specific context, namely a die-transfer tool and method used for transferring (i.e., from a source frame to a target frame) dies of a processed wafer that have undergone a double-sided sawing process. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

FIGS. 1A to 1D illustrate cross-sectional views of various stages in a singulation process in accordance with some embodiments of the present disclosure. Referring to FIG. 1A, a processed wafer 100 is provided. In FIG. 1A, a portion of a processed wafer 100 is illustrated. The processed wafer 100 includes die areas DA and non-die areas NA. Generally, active and/or passive devices are formed in the die areas DA, and the non-die areas NA do not have any active or passive devices formed therein. The non-die areas NA may include scribe lines (sometimes also referred to as dicing streets) SL for singulating the die areas DA into separate integrated circuit (IC) dies 100*a* and 100*b* in processes that are described later.

In some embodiments, the processed wafer 100 may be a logic wafer, a memory wafer, a sensor wafer, a micro-electro-mechanical-system (MEMS) wafer, a signal processing wafer, the like, or a combination thereof. The processed wafer 100 may be formed using a complementary metal-oxide-semiconductor (CMOS) process, a MEMS process, a nano-electro-mechanical systems (NEMS) process, the like, or a combination thereof. In some embodiments, the processed wafer 100 includes a semiconductor substrate 110, an interconnect structure 120, and contact pads 130, as shown in FIG. 1A. Additional features can be added to the processed wafer 100, and/or some of the features described below can be replaced or eliminated in other embodiments.

The semiconductor substrate 110 may be a substrate of silicon, doped or undoped, or an active layer of a semiconductor-on-insulator (SOI) substrate. The semiconductor substrate 110 may include other semiconductor materials, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, and the like, may be formed in and/or on an active surface (e.g., the surface facing upward) of the semiconductor substrate 110.

In some cases, conductive vias (not shown) may be formed to extend into the semiconductor substrate 110 from the active surface of the semiconductor substrate 110. When initially formed, the conductive vias do not extend to an inactive surface (e.g., the surface facing downward, opposite the active surface) of the semiconductor substrate 110. In a subsequent step, a removal or thinning process, such as a chemical-mechanical polish (CMP) process, may be performed on the inactive surface of the semiconductor substrate 110 to expose the conductive vias. Therefore, the devices and/or components on both sides of the semiconductor substrate 110 can communicate with each other through the conductive vias. The conductive vias are also sometime referred to as through-substrate vias or through-silicon vias (TSVs) when the semiconductor substrate 110 is a silicon substrate. Materials and formation methods of the conductive vias are well known in the art and will not be described further here. In some embodiments, conductive vias may also be omitted.

The interconnect structure 120 is formed on the active surface of the semiconductor substrate 110 and over the conductive vias (if any). The interconnect structure 120 may include one or more dielectric layer(s) and respective metallization layer(s) in the dielectric layer(s)(not specifically shown). The dielectric layer(s) may be inter-metallization dielectric (IMD) layers. The inter-metallization dielectric layers may be formed, for example, of a low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spin-on coating, chemical vapor deposition (CVD), plasma-enhanced chemical vapor deposition (PECVD), high-density plasma chemical vapor deposition (HDP-CVD), or the like.

The metallization pattern(s) in the dielectric layer(s) may route electrical signals between the devices of the semiconductor substrate 110, such as by using vias and/or traces, and may also contain various electrical devices, such as capacitors, resistors, inductors, or the like. The metallization pattern(s) may be formed from a conductive material such as copper, aluminum, the like, or combinations thereof. The various devices and metallization patterns may be interconnected to perform one or more functions. The functions may include memory structures, processing structures, sensors, amplifiers, power distribution, input/output circuitry, or the like.

The contact pads 130 are formed in or on the interconnect structure 120. The contact pads 130 are physical and electrically coupled to circuitry in the processed wafer 100, such as the metallization pattern(s) of the interconnect structure 120 and/or the conductive vias in the semiconductor substrate 110, and it can provide an external electrical connection to the circuitry or devices. The contact pads 130 may include a conductive material such as copper, tungsten, aluminum, silver, gold, the like, or a combination thereof, and may be formed by an electro-chemical plating process, an electroless plating process, atomic layer deposition (ALD), physical vapor deposition (PVD), the like, or a combination thereof. In some embodiments, the contact pads 130 may further comprise a thin seed layer (not shown), wherein the conductive material of the contact pads 130 is deposited over the thin seed layer. The seed layer may comprise copper, titanium, nickel, gold, manganese, the like, or a combination thereof, and may be formed by ALD, PVD, sputtering, the like, or a combination thereof. In some embodiments, a planarization process, such as a CMP, may be performed so that the top surfaces of the contact pads 130 are substantially co-planar with the top surface of the interconnect structure 120, as shown in FIG. 1A. In some other embodiments, the contact pads 130 can extend above the surrounding dielectric layer(s) of the interconnect structure 120.

Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies (KGD) to increase the yield and decrease costs.

Figure 1B:
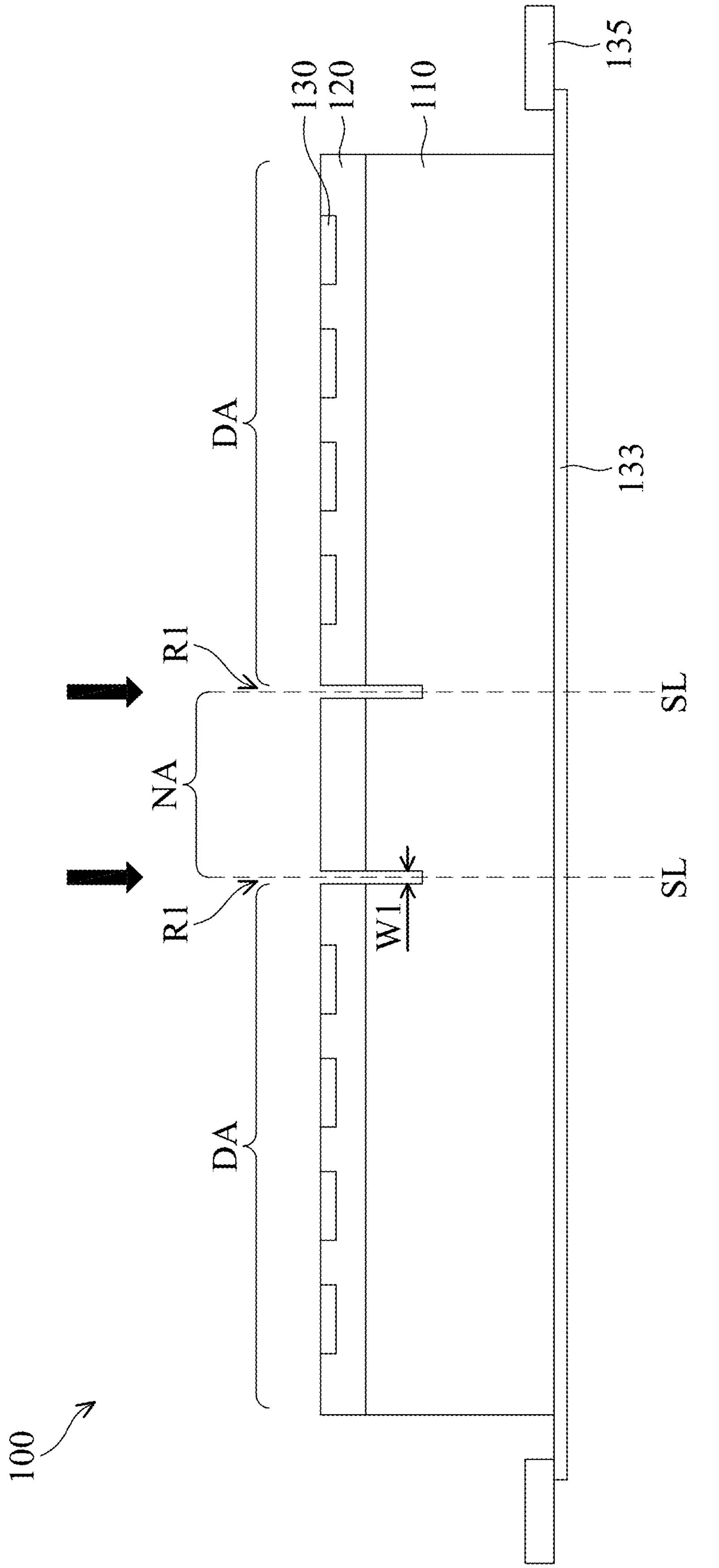

As shown in FIG. 1B, the structure shown in FIG. 1A is attached to a tape 133 (e.g., a dicing tape) supported by a frame 135. Afterwards, a first sawing process (as indicated by the thin solid arrows) is performed to remove portions of the interconnect structure 120 and portions of the semiconductor substrate 110 in the non-die areas NA to form first trenches R1. In some embodiments, the first sawing process is performed to remove portions of the interconnect structure 120 and semiconductor substrate 110 along the scribe lines SL to form the first trenches R1. Although not shown, the first trenches R1 surround each die area DA in plan view. In some embodiments, the first sawing process is performed to remove a portion of the semiconductor substrate 110, while leaving another portion of the semiconductor substrate 110. That is, each first trench R1 is formed to extend from the top surface of the interconnect structure 120 to a certain depth in the semiconductor substrate 110, but does not penetrate the semiconductor substrate 110. The width W1 of each first trench R1 may be in a range of about 8 μm to about 15 μm in some cases, but the disclosure is not limited thereto. In some embodiments, the first sawing process is performed using plasma dicing, but other acceptable sawing processes may also be used, including laser dicing, mechanical saw, or a combination thereof. In some embodiments, the tape 133 and the frame 135 are optional in the first sawing process.

Figure 1C:
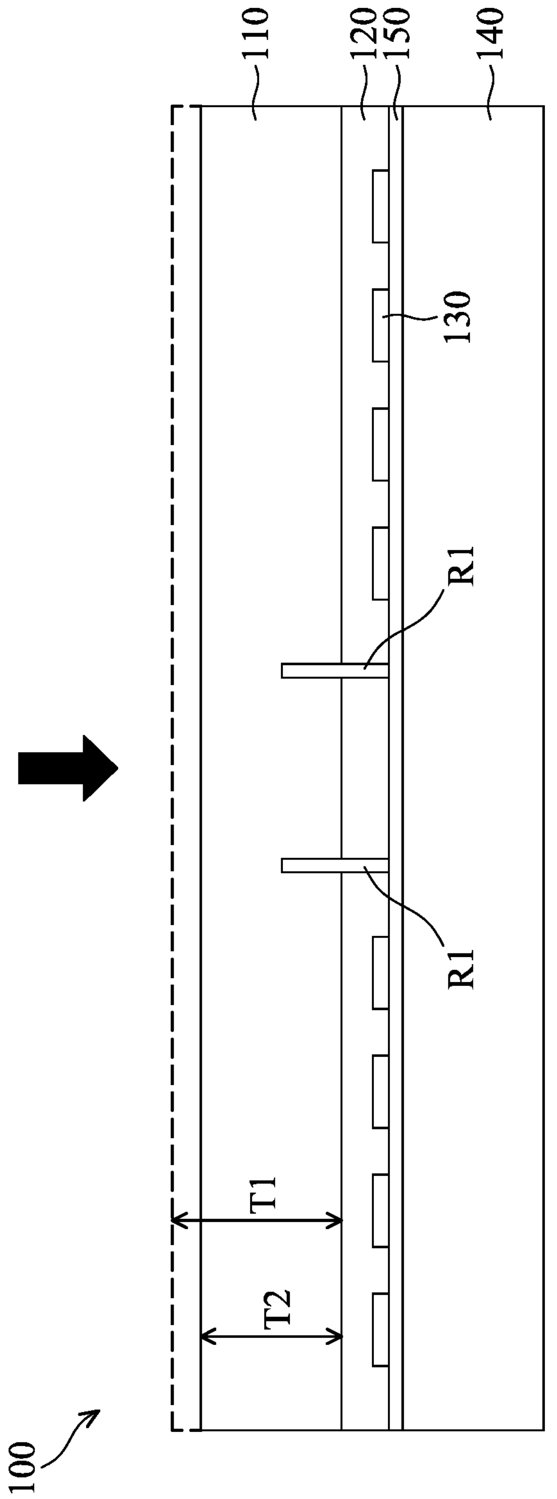

As shown in FIG. 1C, after the first sawing process, the resulting structure of FIG. 1B is flipped (i.e., upside down) and attached to a carrier 140. The carrier 140 can provide temporary mechanical and structural support to various features of the processed wafer 100 during subsequent processing steps. The carrier 140 may be a glass carrier, a silicon wafer, an organic carrier, or the like. Alternatively, the carrier 140 may be a back grinding (BG) tape in some embodiments. In some embodiments, a release layer 150 is used to attach the processed wafer 100 to the carrier 140. The release layer 150 may be a die attach film or any suitable adhesive, epoxy, ultraviolet (UV) glue (which loses its adhesive property when exposed to UV radiation), or the like. The release layer 150 may be formed using a deposition process, a spin coating, a printing process, a lamination process, or the like over the surface of the carrier 140 or over the surface of the processed wafer 100. In other embodiments, the release layer 150 may be a thermal tape, wherein adhesive strength of the release layer 150 is substantially reduced after exposing it to a suitable heat source.

Referring further to FIG. 1C, a thinning process (as indicated by the thick solid arrow) is performed to the semiconductor substrate 110 to remove portions of the semiconductor substrate 110 until a desirable thickness T2 of the semiconductor substrate 110 is achieved. In some embodiments, the semiconductor substrate 110 is thinned from an initial thickness T1 (dashed line) to the thickness T2 (solid line) through the thinning process. In some embodiments, a ratio of the thickness T2 to the thickness T1 ranges from about 0.1 to about 0.5, but the disclosure is not limited thereto. In some embodiments, after the thinning process, the conductive vias in the semiconductor substrate 110 are exposed. The thinning process may include a back-grinding process, a polishing process, an etching process, or a combination thereof.

After the thinning process, the processed wafer 100 is de-bonded from the carrier 140 in a subsequent step (not specifically shown). For example, the de-bonding process includes projecting light, such as a laser light or an UV light, on the release layer 150 (e.g., a light-to-heat conversion layer) to decompose the release layer 150 under the heat of light, so that the carrier 140 can be easily removed along with the release layer 150.

Figure 1D:
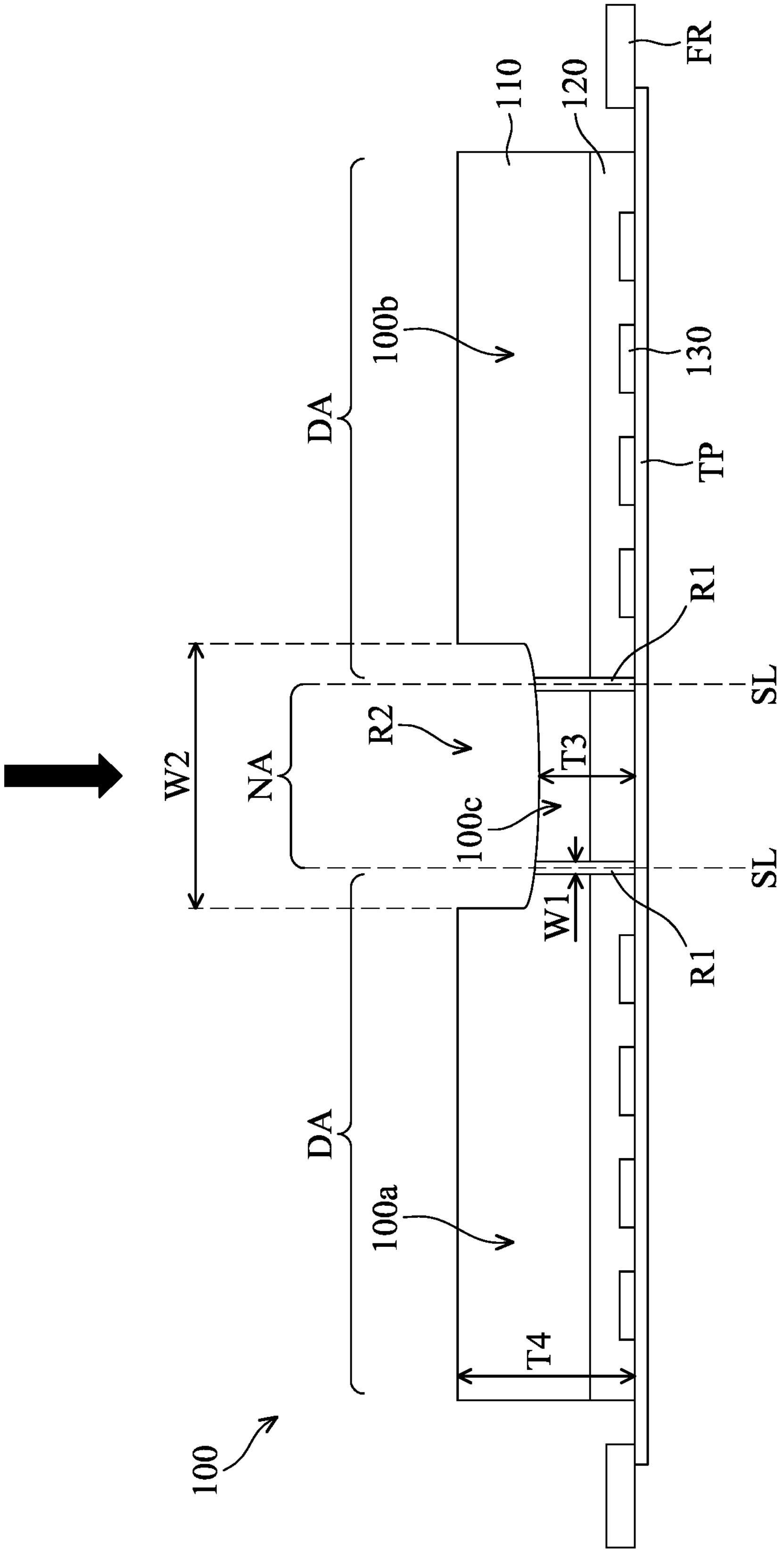

As shown in FIG. 1D, after the thinning process and de-bonding process, the processed wafer 100 is attached to a tape TP (e.g., a dicing tape) supported by a frame FR, wherein the tape TP directly contacts the interconnect structure 120 and the contact pads 130. Afterwards, a second sawing process (as indicated by the thin solid arrow) is performed to remove portions of the semiconductor substrate 110 in or along the non-die areas NA to form second trenches R2. Although not shown, the second trenches R2 surround each die area DA in plan view. In some embodiments, the width W2 of each second trench R2 is substantially equal to or slightly greater than (see FIG. 1D) the width of the respective non-die area NA. In some embodiments, the second sawing process is performed to form the second trenches R2 in the semiconductor substrate 110 until the bottom surface of each second trench R2 reaches (i.e., being physically connected to) the previously-formed first trenches R1 in the non-die area NA, as shown in FIG. 1D. Therefore, it can separate the die areas DA from each other, thereby obtaining multiple singulated (i.e., separated) IC dies (e.g., 100*a* and 100*b*). In some embodiments, the second sawing process is performed using mechanical saw, but other acceptable sawing processes may also be used, including plasma dicing, laser dicing, or a combination thereof.

In some embodiments, as shown in FIG. 1D, each second trench R2 is formed to have vertical sidewalls and a curved bottom surface, but any other acceptable shapes may also be used. For example, the sidewalls of the second trench R2 may be perpendicular or inclined to the backside (e.g., the side facing upward) of the semiconductor surface 110, and the bottom surface of the second trench R2 may be curved, flat, or sharp in various embodiments.

Referring further to FIG. 1D, after the second sawing process, the thickness T3 of the non-die portions 100*c* (i.e., the non-die areas NA) is less than the thickness T4 of the IC dies 100*a* and 100*b* (i.e., die areas DA). This helps avoid the transfer of the non-die portions 100*c* along with the IC dies 100*a* and 100*b* to the target frame during the subsequent die-transfer process, thereby improving the die-transfer yield.

Moreover, the advantage of the double-sided sawing process described above (i.e., two sawing processes are performed on the frontside and backside of the processed wafer 100) is that the stress created in the processed wafer 100 during sawing can be reduced. In contrast, if a trench is formed to penetrate the entire processed wafer 100 in only one sawing process, excessive stress may occur in the wafer during dicing, which can lead to device damage in the wafer. In some alternative embodiments, two or more sawing processes (either from one side or from both sides of the wafer) may also be performed, as long as the thickness T3 of the non-die portions 100*c* is less than the thickness T4 of the IC dies 100*a* and 100*b* after the singulation process shown in FIGS. 1A to 1D.

After the singulation process, and before the die-transfer process that is described below, an expanding process (not specifically shown) and a curing process (not specifically shown) can be further performed in some embodiments. The expanding process is performed by an expanding machine (or called an expander) to expand the tape TP, so that the minimum distance MD (see FIG. 2) between an IC die (e.g., 100*a* or 100*b*) and an adjacent non-die portion (e.g., 100*c*), which corresponds to the width W1 of the first trench R1 (see FIG. 1D), is increased. In some embodiments, after the expanding process, the minimum distance MD can be greater than about 30 μm. This helps reduce the possibility of IC dies (100*a*, 100*b*) and non-die portions (100*c*) collisions during the subsequent die-transfer process, thereby improving the die-transfer yield. The curing process (sometimes also referred to as a pre-debonding process) is performed by exposing the tape TP to a suitable heat or light source (depending on the material of the tape TP), so that the adhesive strength of the tape TP is substantially reduced. Therefore, the IC dies 100*a* and 100*b* can be successfully transferred from the tape TP in the subsequent die-transfer process.

Figure 2A:
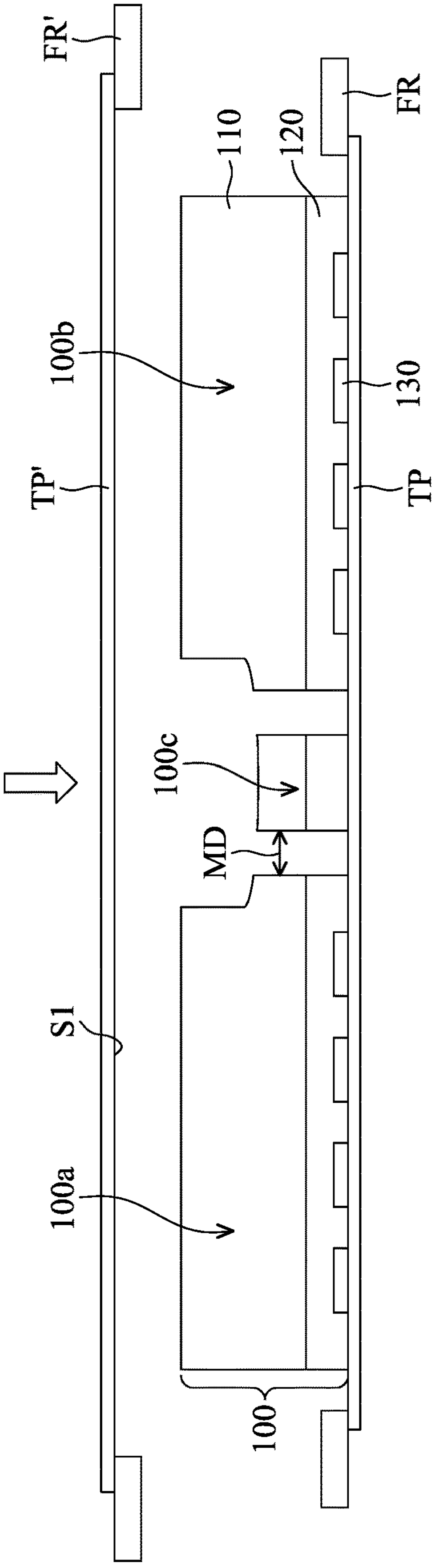
FIGS. 2A to 2C illustrate cross-sectional views of various stages in a wafer-level die-transfer method in accordance with some embodiments of the present disclosure.
Figure 2B:
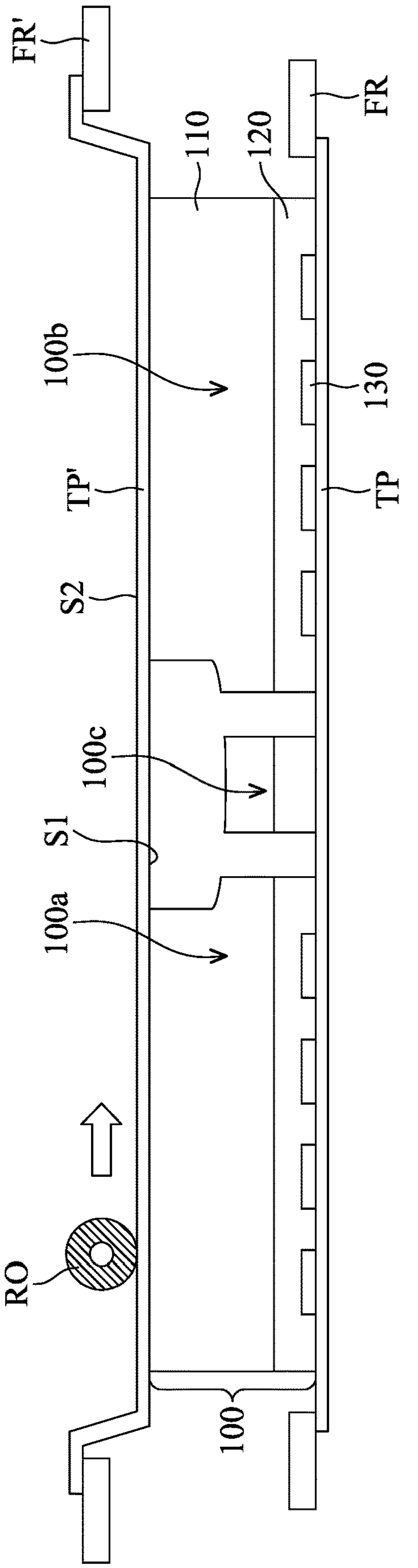
Figure 2C:
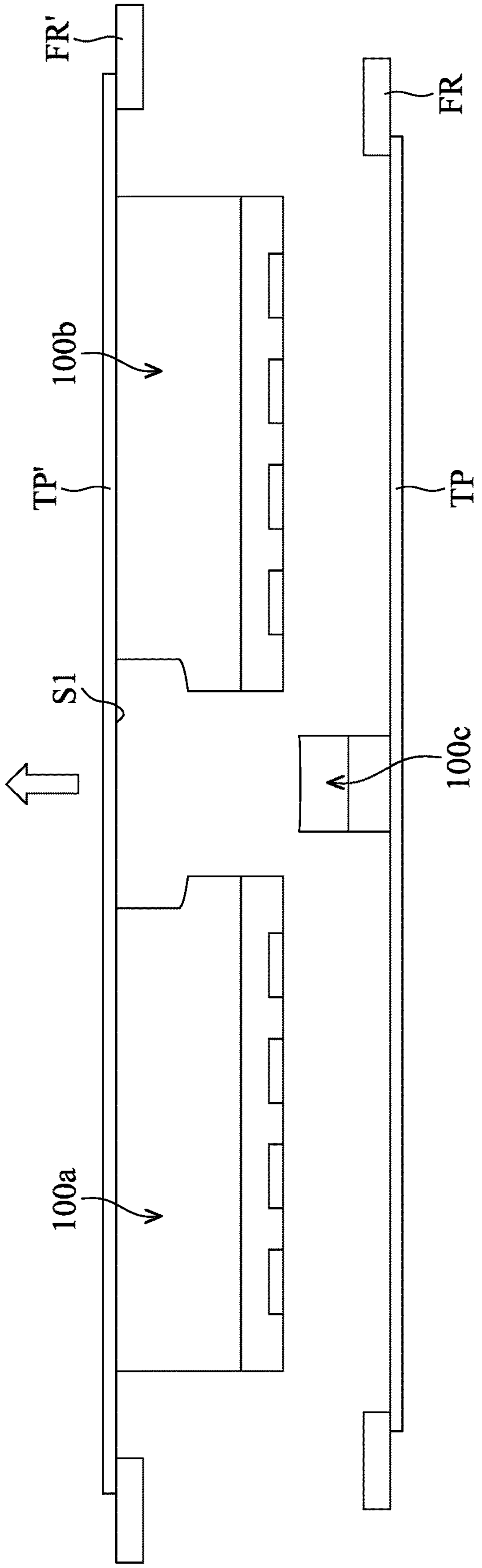

FIGS. 2A to 2C illustrate cross-sectional views of various stages in a wafer-level die-transfer method in accordance with some embodiments of the present disclosure. The die-transfer method is performed after the above-mentioned singulation process, expanding process, and curing process (or pre-debonding process). As shown in FIG. 2A, a frame FR (for illustration, hereinafter also referred to as a source frame FR) supporting a first tape TP is provided, wherein the first tape TP has a processed wafer 100 thereon, and the processed wafer 100 have been separated into multiple IC dies 100*a*, 100*b* and non-die portions 100*c* by the singulation process described above. Another frame FR' (for illustration, hereinafter also referred to as a target frame FR') supporting a second tape TP' is provided, and the target frame FR' is located above the source frame FR. Unlike the source frame FR, the target frame FR' is flipped (i.e., upside down) so that the adhesive surface S1 of the second tape TP' faces downward. At this stage, the target frame FR' is lowered to a certain position above the source frame FR so that the adhesive surface S1 of the second tape TP' is close to the processed wafer 100 on the first tape TP. In some embodiments, the second tape TP' has greater adhesive strength than the first tape TP. For example, the first tape TP has undergone the heat or light curing process to reduce its adhesive strength, but the second tape TP' still remains its adhesive strength.

As shown in FIG. 2B, a dies adhering (to the target frame FR') process is then performed by moving a roller RO laterally over the non-adhesive surface S2 of the second tape TP' opposite the adhesive surface S1, so that the singulated IC dies 100*a* and 100*b* of the processed wafer 100 on the first tape TP contact and adhere to the adhesive surface S1 of the second tape TP. By moving the roller RO across the non-adhesive surface S2 of the second tape TP', pressure can be created on the second tape TP' to pull the entire second tape TP' down, so that the singulated IC dies 100*a* and 100*b* of the processed wafer 100 on the underlying first tape TP are brought into contact and adhered to the adhesive surface S1 of the second tape TP. As described above, since the thickness T3 of the non-die portions 100*c* is less than the thickness T4 of the IC dies 100*a* and 100*b* (see FIG. 1D) after the singulation process, the non-die portions 100*c* do not contact and adhere to the adhesive surface S1 of the second tape TP.

As shown in FIG. 2C, after the dies adhering process of FIG. 2B, the target frame FR' starts to move up. Due to the relatively high adhesive strength of the second tape TP', the singulated IC dies 100*a* and 100*b* of the processed wafer 100 on the first tape TP can be attracted upwardly by the second tape TP' during the upward movement of the target frame FR'. When the target frame FR' is moved to a certain height above the source frame FR, all IC dies 100*a* and 100*b* of the processed wafer 100 can be de-bonded from the first tape TP and transferred to the second tape TP' while non-die portions 100*c* remain on the first tape TP. Therefore, all the dies of the processed wafer 100 (i.e., wafer-level dies) can be transferred simultaneously. Consequently, the efficiency of transferring dies is significantly improved.

Furthermore, the above die-transfer method picks up the singulated IC dies 100*a* and 100*b* from the backside of the semiconductor substrate 110, and does not use an ejector to eject the dies from under the first tape TP during die transfer, unlike other die-transfer methods using pick-and-place tools, so there is also less die damage during die transfer using the die-transfer method disclosed herein.

Figure 3:
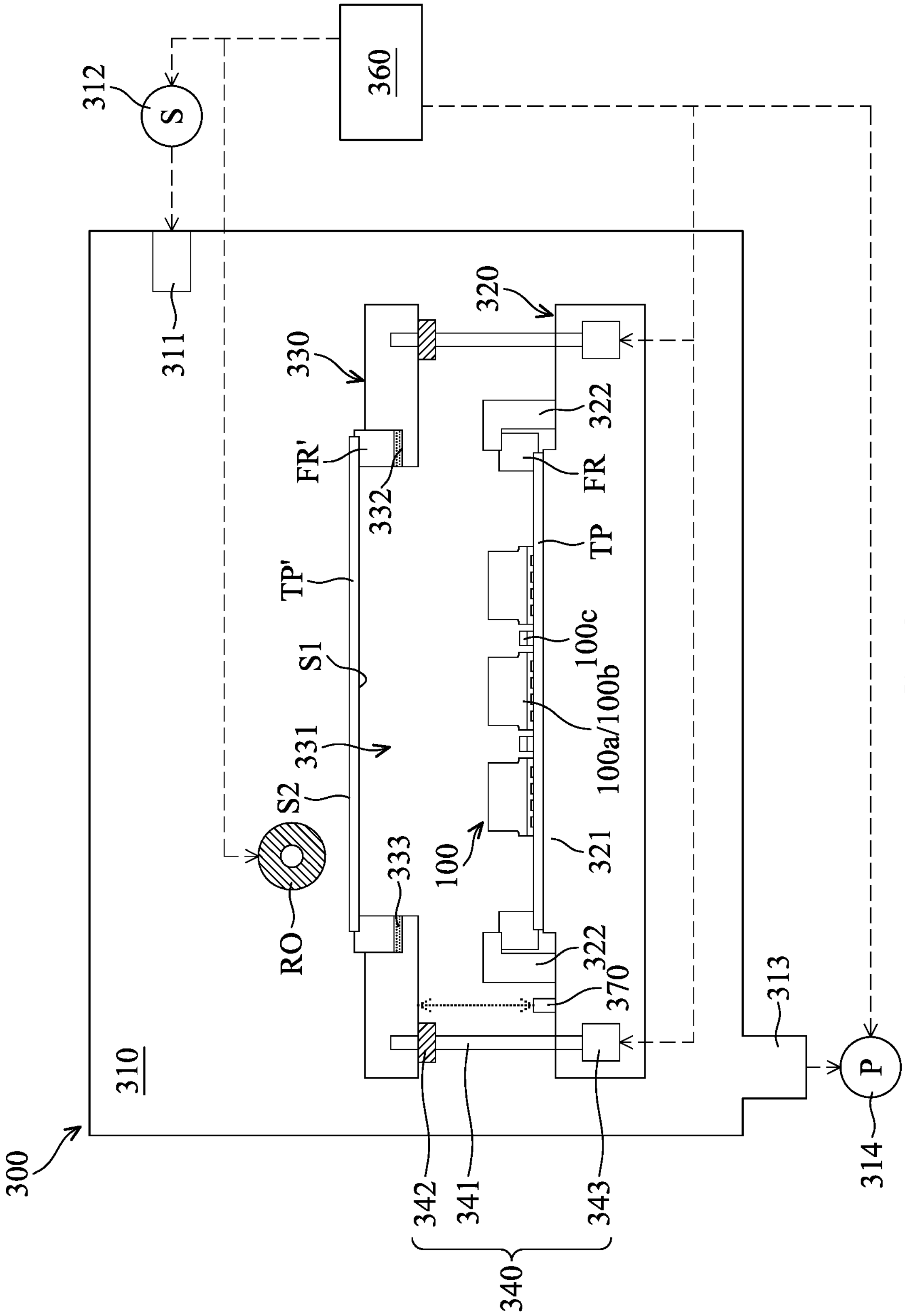
FIG. 3 is a schematic cross-sectional view of a die-transfer tool for performing the die-transfer method of FIGS. 2A to 2C in accordance with some embodiments of the present disclosure.

FIG. 3 is a schematic cross-sectional view of a die-transfer tool 300 for performing the die-transfer method of FIGS. 2A to 2C in accordance with some embodiments of the present disclosure. As shown in FIG. 3, the die-transfer tool 300 includes a processing chamber 310, a source frame stage 320, a target frame stage 330, one or more driving mechanisms 340, and a roller RO. Additional features can be added to the die-transfer tool 300, and/or some of the features described below can be replaced or eliminated in other embodiments.

The processing chamber 310 is configured to provide a sealed, contained environment for receiving source frame stage 320, target frame stage 330, driving mechanisms 340, and roller RO. One or more load ports (not shown) may be coupled to the processing chamber 310 for allowing frames (e.g., source frame FR and target frame FR') to enter and exit the die-transfer tool 300. A gas inlet port 311 is located on a sidewall of the processing chamber 310 and connected to a gas supply source 312 for introducing a purge gas (e.g., nitrogen) flow into the processing chamber 310, and a gas outlet port 313 is located on the bottom wall of the processing chamber 310 and connected to an exhaust pump 314 for discharging the purge gas flow from the processing chamber 310. By providing the purge gas flow, it reduces contaminants or particles from the frames remaining in the processing chamber 310, thereby improving process yield. The configuration of the processing chamber 310 (e.g., the gas inlet port 311 and gas outlet port 313) shown in FIG. 3 is merely an illustrative example, and is not intended to be, and should not be constructed to be, limiting to the present disclosure. For example, one or more purge gas dispensers/distributors may be located in the processing chamber 310 proximate the source frame FR and target frame FR' in replace of the gas inlet port 311 on the sidewall of the processing chamber 310.

The source frame stage 320 is configured to secure or hold a source frame FR supporting a first tape TP, wherein the first tape TP has a processed wafer 100 thereon. The processed wafer 100 has been separated into multiple IC dies 100*a*/100*b* and non-die portions 100*c* through the singulation process described above. The source frame stage 320 is a stationary component in the die-transfer tool 300. In some embodiments, the source frame stage 320 has a raised portion 321 on the top surface thereof, wherein the raised portion 321 is configured to support the first tape TP. The source frame stage 320 further has multiple latch mechanisms 322 affixed around the raised portion 321, wherein the latch mechanisms 322 are configured to clamp and secure the source frame FR. Types of latch mechanisms 322 may include L-clamps, C-clamps, or other suitable latch mechanism known in the art. In some alternative embodiments, the latch mechanisms 322 are omitted, and other clamping mechanisms (e.g., magnetic attraction components) can be used to secure and attract the source frame FR, which will be described in FIG. 5.

The target frame stage 330 is configured to secure or hold a target frame FR' supporting a second tape TP', and is located above the source frame stage 320. Particularly, the target frame FR' is mounted on the target frame stage 330 with the adhesive surface S1 of the second tape TP' facing downward (i.e., facing the underlying source frame stage 320 and the source frame FR thereon). In some embodiments, the target frame stage 330 has a hollow space 331 extending through the top surface and bottom surface of the target frame stage 330, and a recess 332 disposed around the hollow space 331. The recess 332 is configured to receive or support the target frame FR'. As shown in FIG. 3, when the target frame FR' is received or fitted in the recess 332, the adhesive surface S1 of the second tape TP' is exposed from the bottom surface of the target frame stage 330 through the hollow space 331. In some embodiments, at least one magnet 333 is disposed around the hollow space 331 (e.g., disposed at the bottom of the recess 332) and configured to attract and secure the target frame FR'. Other suitable arrangements of the magnet 333 and/or other clamping/latch mechanisms that can secure the target frame FR' may also be used in other embodiments.

The driving mechanism 340 is configured to vertically drive the target frame stage 330 to adjust the relative position of the target frame stage 330 above the source frame stage 320. In some embodiments, the driving mechanism 340 includes a linear guide rail (e.g., a screw 341), a slider (e.g., a nut 342), and a motor (e.g., a rotary driving motor 343). The screw 341 and the nut 342 can be coupled together and form a lead screw that can convert a rotational movement of the screw 341 into a linear movement of the nut 342 along the screw 341. The rotary driving motor 343 is configured to drive the screw 341 to rotate. The nut 342 is attached to the target frame stage 330. In some embodiments where the target frame stage 330 has a rectangular shape in plan view (e.g., see FIG. 6), four driving mechanisms 340 can be provided at four corners of the target frame stage 330. Other acceptable numbers of the driving mechanisms 340 may also be used in other embodiments.

With the above configurations, the driving mechanisms 340 can drive the target frame stage 330 (and the target frame FR' and second tape TP' thereon) to move vertically relative to the source frame stage 320. The configuration of the driving mechanisms shown in FIG. 3 is merely an illustrative example, and is not intended to be, and should not be constructed to be, limiting to the present disclosure. For example, the motor 343 may not be disposed in the source frame stage 320 as shown in FIG. 3, and may be disposed directly on the bottom wall of the processing chamber 310 in some cases. Furthermore, other suitable linear driving mechanisms, including spindles, belts, linear motors, the like, and/or the combination thereof, may also be used in place of the driving mechanism 340 shown in FIG. 3.

The roller RO is configured to move laterally over the non-adhesive surface S2 of the second tape TP' under the drive of a rotary driving motor (not shown). The roller RO may be arranged proximate the target frame stage 330. In some alternative embodiments, the roller RO can also be moved or driven vertically (not specifically shown).

The operations (e.g., start, stop, speed of movement) of the driving mechanisms 340 are controlled by a controller 360 (e.g., a computer). In some embodiments, the controller 360 is a computer device including one or more processing units and one or more memory devices. The processing units can be implemented in numerous ways, such as with dedicated hardware, or with general-purpose hardware (e.g., a single processor, multiple processors or graphics processing units capable of parallel computations, etc.) that is programmed using microcode or software instructions to perform the functions described herein. Each memory device can be a random access memory (RAM), a read-only memory (ROM) or the like. The controller 360 also provides control over the operations of gas supply source 312, exhaust pump 314, and roller RO.

In some embodiments, as shown in FIG. 3, the die-transfer tool 300 further includes a distance detector 370 (e.g., a laser interferometer) provided between the source frame stage 320 and the target frame stage 330 and configured to optically detect the distance between the source frame stage 320 and the target frame stage 330 and/or the relative position of the target frame stage 330 above the source frame stage 320. The distance detector 370 is also capable of generating a position (or distance) signal in response to the position of the target frame stage 330 and sending the position signal to the controller 360. The controller 360 then controls the operations of the driving mechanisms 340 according to the position signal from the distance detector 370.

Next, referring to FIGS. 4A to 4D, which illustrate cross-sectional views of various stages in the die-transfer method performed by a portion of the die-transfer tool 300 of FIG. 3 in accordance with some embodiments of the present disclosure. In FIGS. 4A to 4D, only source frame stage 320, target frame stage 330, driving mechanisms 340, and roller RO are shown.

Figure 4A:
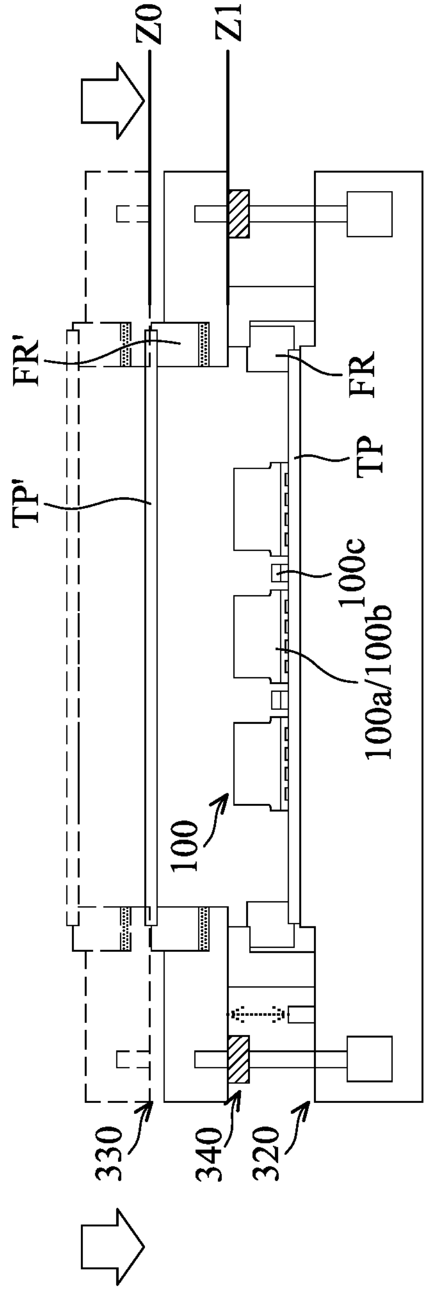
FIGS. 4A to 4D illustrate cross-sectional views of various stages in the die-transfer method performed by a portion of the die-transfer tool of FIG. 3 in accordance with some embodiments of the present disclosure.

As shown in FIG. 4A, after the source frame FR is fixed to the source frame stage 320 and the target frame FR' is fixed to the target frame stage 330, the target frame stage 330 starts to move and is lowered from an initial position Z0 (indicated by dotted lines) to a first height (or position) Z1 above the source frame stage 320 under the drive of the driving mechanisms 340 controlled by the controller 360 (see FIG. 3). In some embodiments, the target frame stage 330 stops at the first height Z1, otherwise it may collide with some features (e.g., latch mechanisms 322) on the source frame stage 320.

Figure 4B:
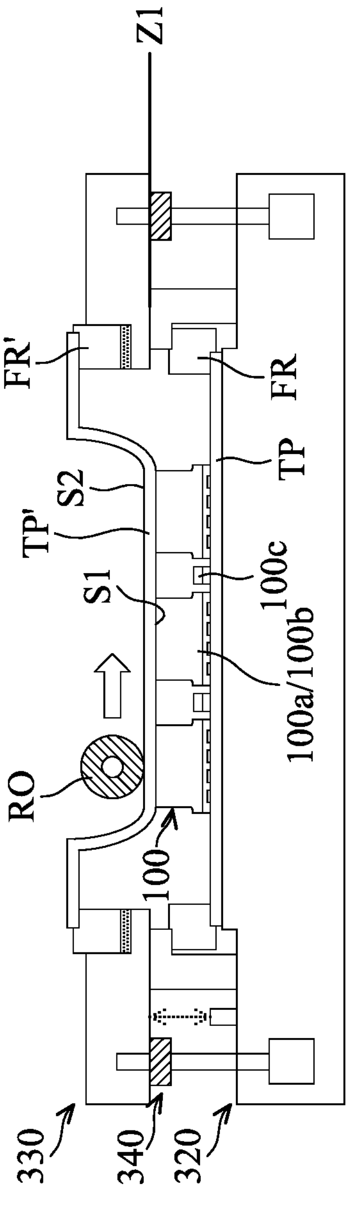

As shown in FIG. 4B, after the target frame stage 330 reaches the first height Z1, the roller RO moves to the non-adhesive surface S2 of the second tape TP' on the target frame stage 330, and then it moves laterally over the non-adhesive surface S2 under the drive of a rotary driving motor (not shown) controlled by the controller 360 (see FIG. 3). By moving and pressing the roller RO over the non-adhesive surface S2 of the second tape TP', the singulated IC dies 100*a* and 100*b* of the processed wafer 100 on the underlying first tape TP can be brought into contact and adhered to the adhesive surface S1 of the second tape TP. The roller RO is then moved away from the second tape TP'.

Figure 4C:
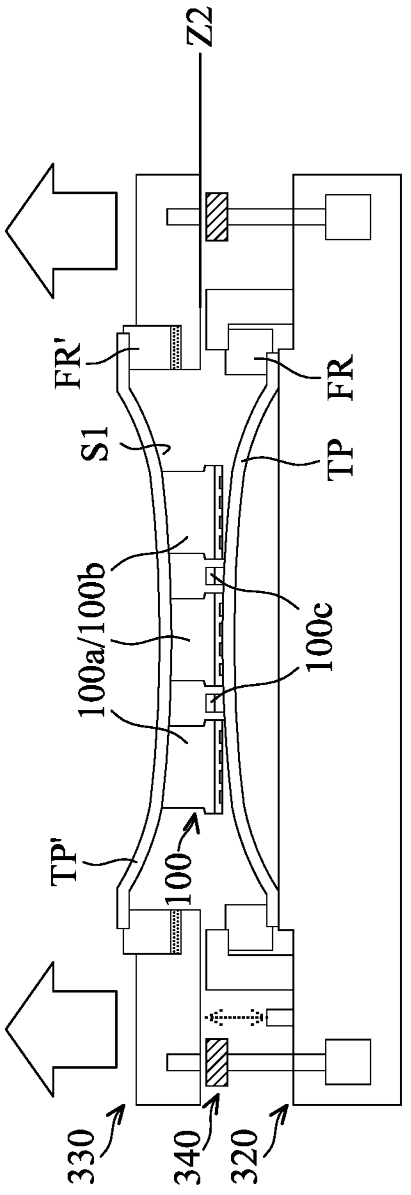

As shown in FIG. 4C, after the roller RO is moved away from the second tape TP', the target frame stage 330 starts to move upward under the drive of the driving mechanisms 340 controlled by the controller 360 (see FIG. 3). Subsequently, when the target frame stage 330 is elevated to a certain height (e.g., a second height Z2 higher than the first height Z1, shown in FIG. 4C) above the source frame stage 330, the singulated IC dies 100*a* and 100*b* of the processed wafer 100 are de-bonded from the first tape TP and transferred to the second tape TP' while non-die portions 100*c* remain on the first tape TP. In some embodiments, when the target frame stage 330 reaches a certain height (e.g., second height Z2) above the source frame stage 320, all the dies of the processed wafer 100 (i.e., wafer-level dies) are transferred to the second tape TP' simultaneously.

In some embodiments, the target frame stage 330 is moved at a constant speed (e.g., about 100 μm/s) by the driving mechanism 340 until all the dies of the processed wafer 100 are transferred to the second tape TP'. The movement speed may be appropriately selected and controlled to avoid excessive deformation of the first tape TP due to the attraction of the second tape TP', otherwise the IC dies 100*a*, 100*b* and the non-die portions 100*c* on the first tape TP are prone to collision and damage (leading to a decrease in process yield).

Figure 4D:
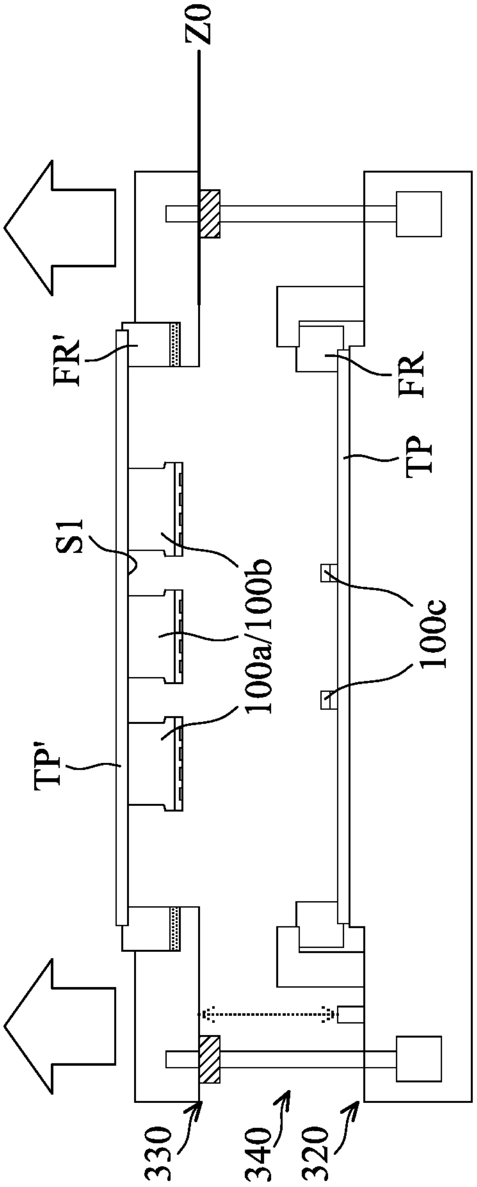

As shown in FIG. 4D, after all the dies (e.g., 100*a* and 100*b*) of the processed wafer 100 are successfully transferred to the second tape TP', the target frame stage 330 continues to move upward under the drive of the driving mechanisms 340 controlled by the controller 360 (see FIG. 3) until it returns to the initial position Z0. At this stage, the movement speed (e.g., about 10 mm/s) of the target frame stage 330 may be higher than the movement speed of the target frame stage 330 at the stage of FIG. 4C to increase the process efficiency.

Afterwards, the target frame FR' with the transferred IC dies can be removed from the die-transfer tool 300 for further processing (not shown). For example, one or more IC dies can then be stacked or bonded on top of another package component to form a two-dimensional (2D), a two-and-a-half dimensional (2.5D) or a 3D package, such as a flip-chip package, a chip-on-wafer-on-substrate (CoWoS) package, an integrated fan-out (InFO) package, a system-on-integrated-chips (SoIC) package, a package-on-package (POP) package, or the like.

Figure 5:
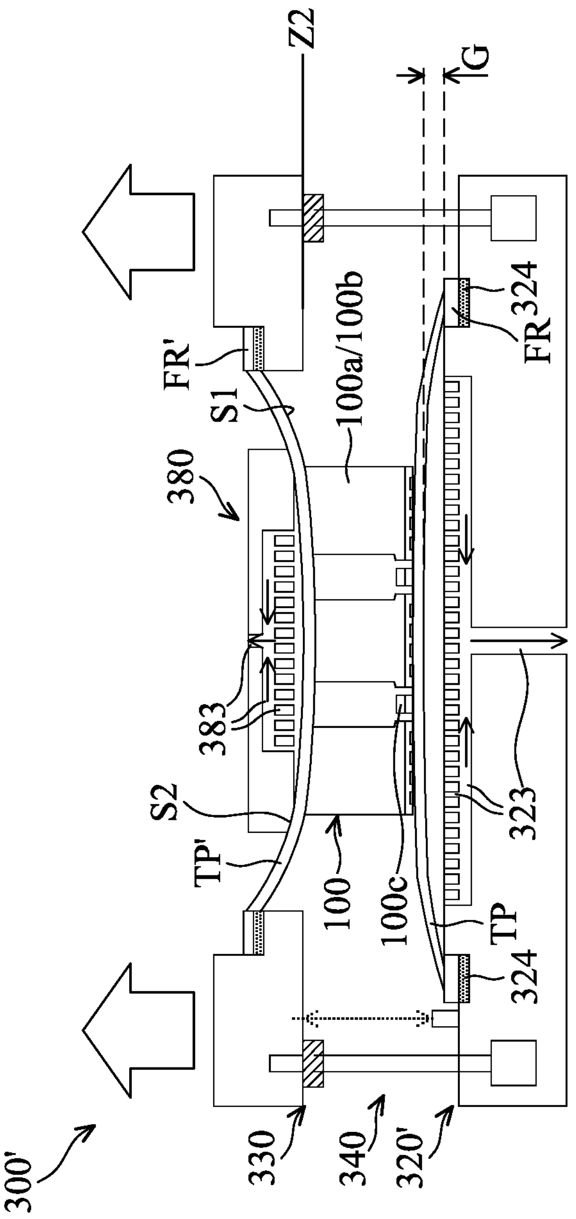
FIG. 5 is a schematic cross-sectional view of a portion of a die-transfer tool in accordance with some embodiments of the present disclosure.

FIG. 5 is a schematic cross-sectional view of a portion of a die-transfer tool 300' in accordance with some alternative embodiments of the present disclosure. FIG. 5 also illustrates the stage of the die-transfer method corresponding to that shown in FIG. 4C. For simplicity, only source frame stage 320', target frame stage 330, and driving mechanisms 340 are shown in FIG. 5. The die-transfer tool 300' of FIG. 5 is similar to the die-transfer tool embodiments described above (e.g., the die-transfer tool 300 of FIG. 3), and the following description will detail the dissimilarities among those embodiments and the identical features will not be redundantly described.

As shown in FIG. 5, the source frame stage 320' is a bottom vacuum chuck that includes multiple vacuum channels 323 therein, unlike the source frame stage 320 shown in FIG. 3. The vacuum channels 323 may extend to the top surface of the raised portion 321 and may extend to the bottom surface of the source frame stage 320' for connected to a vacuum pump (not shown). Therefore, a vacuum attraction can be generated by the vacuum pump between the first tape TP and the top surface of the source frame stage 320' through the vacuum channels 323 (as indicated by the thin solid arrows). By additionally providing vacuum suction from the source frame stage 320' when elevating the target frame stage 330, it helps reduce deformation of the first tape TP due to the attraction of the second tape TP', thereby reducing the possibility of collisions between the IC dies (100*a*, 100*b*) and non-die portions (100*c*) on the first tape TP during the die-transfer process. Accordingly, the die-transfer yield is further improved. In some embodiments, as shown in FIG. 5, the (maximum) gap G between the deformed first tape TP and the top surface of the source frame stage 320' may be controlled to be about 100 μm or less during the die-transfer process, due to the vacuum suction from the source frame stage 320'.

In addition, the multiple latch mechanisms 322 (see FIG. 3) on the source frame stage 320' can be omitted and replaced with at least one magnetic attraction components (e.g., one or more magnets 324). The magnet or magnets 324 may be disposed around the raised portion 321 and in/on the source frame stage 320' to attract and secure the source frame FR.

Referring further to FIG. 5, a top vacuum chuck 380 with multiple vacuum channels 383 is further provided in some embodiments. The top vacuum chuck 380 can be placed in contact with the non-adhesive surface S2 of the second tape TP' on the target frame stage 330 after the roller RO is removed away from the second tape TP' (i.e., after the dies adhering process as illustrated in FIG. 2B and FIG. 4B). The vacuum channels 383 may extend to the bottom surface (close to the second tape TP') of the top vacuum chuck 380 and may extend to the top surface of the top vacuum chuck 380 for connected to a vacuum pump (not shown). Therefore, a vacuum attraction can also be generated by the vacuum pump between the bottom surface of the top vacuum chuck 380 and the non-adhesive surface S2 of the second tape TP' through the vacuum channels 383 (as indicated by the thin solid arrows). By additionally providing vacuum suction from the top vacuum chuck 380 (and vacuum suction from the source frame stage 320') when elevating the target frame stage 330, it allows the IC dies 100*a*, 100*b* of the processed wafer 100 to be de-bonded from the first tape TP and transferred to the second tape TP' more quickly. Accordingly, the efficiency of transferring dies is improved further. In other embodiments, the top vacuum chuck 380 can be omitted.

In some embodiments, the vacuum pump coupled to the source frame stage 320' is activated after the source frame FR is mounted on the source frame stage 320' and until all the dies on the first tape TP are transferred to the second tape TP'. In some embodiments, the vacuum pump coupled to the source frame stage 320' is activated after the dies adhering process as illustrated in FIG. 2B and FIG. 4B and until all the dies on the first tape TP are transferred to the second tape TP'. In some embodiments, the vacuum pump coupled to the top vacuum chuck 380 is activated after the dies adhering process as illustrated in FIG. 2B and FIG. 4B and until all the dies on the first tape TP are transferred to the second tape TP'. The operations of those vacuum pumps may be controlled by the controller 360 (see FIG. 3).

Figure 6:
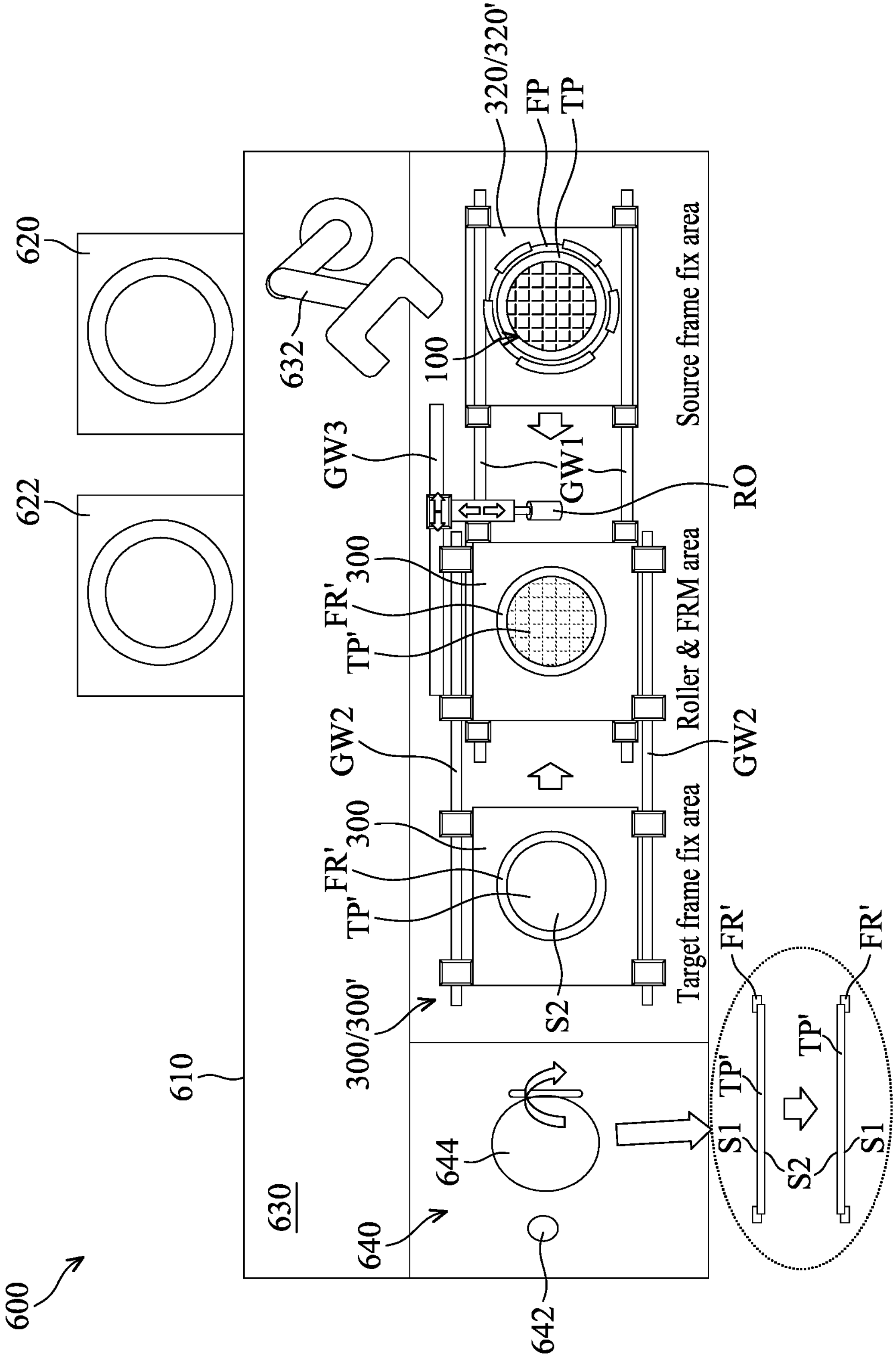
FIG. 6 is a schematic plan view illustrating the arrangement of a die-transfer system in accordance with some embodiments of the present disclosure.

FIG. 6 is a schematic plan view illustrating the arrangement of a die-transfer system 600 in accordance with some embodiments of the present disclosure. As shown in FIG. 6, the die-transfer system 600 includes a housing 610, one or more input frame load ports 620 (only one is shown), one or more output frame load ports 622 (only one is shown), an equipment front end module (EFEM) 630, a frame flipping station 640, and a die-transfer tool (e.g., the die-transfer tool 300 or 300' described above). Additional features can be added to the die-transfer system 600, and/or some of the features described below can be replaced or eliminated in other embodiments.

The housing 610 is configured to provide a sealed, contained system for EFEM 630, frame flipping station 640 and die-transfer tool 300/300'. The input frame load ports 620 and output frame load ports 622 are coupled to the housing 610 for receiving and docking input frames and output frames (e.g., source frame FR and target frame FR'), respectively. The EFEM 630 including at least one frame transfer mechanism 632 (e.g., a multi-axis robot manipulator) is arranged proximate the input frame load ports 620 and output frame load ports and is configured to transfer frames (e.g., source frame FR and target frame FR') into and/or out of the die-transfer system 600. In some embodiments, as shown in FIG. 6, the EFEM 630 is arranged between the input frame load ports 620 and output frame load ports 622 and the frame flipping station 640, and arranged between the input frame load ports 620 and output frame load ports 622 and the die-transfer tool 300/300', for performing the physical transfer of the frames (e.g., source frame FR and target frame FR') between the input frame load ports 620, the output frame load ports 622, the frame flipping station 640, and/or the die-transfer tool 300/300' (which will be described further below).

The frame flipping station 640 is arranged adjacent to the die-transfer tool 300/300' and is configured to flip the target frame FR' prior to mounting the target frame FR' on the target frame stage 330 of the die-transfer tool 300/300', so that the adhesive surface S1 of the second tape TP' faces the source frame stage 320 when the target frame FR' is mounted on the target frame stage 330 (e.g., see FIG. 3). In some embodiments, the frame flipping station 640 includes a lifter 642 and a frame flipping tool 644. The lifter 642 is configured to receive a target frame FR' from the frame transfer mechanism 632. In some other embodiments (not shown), the die-transfer system 600 further includes a frame storage station configured to store unused target frames FR', and the lifter 642 can receive a target frame FR' from the frame storage station. The frame flipping tool 644 is configured to pick up the target frame FR' from the lifter 642 and then flip the target frame FR' (as illustrated in the dashed box in the lower left corner of FIG. 6). Thereafter, a robotic arm (not shown) can transfer the flipped target frame FR' onto the target frame stage 330 of the die-transfer tool 300/300'. Details of the lifter 642 and frame flipping tool 644 are well known in the art and will not be described further here.

The die-transfer tool 300/300' is used to perform the die-transfer method described above, and its same features or configurations as described above are not repeated here. As shown in FIG. 6, the die-transfer tool 300/300' can be divided into three areas, the source frame fix area, the target frame fix area, and the roller and frame reverse mount (FRM) area, in some embodiments.

The source frame stage 320/320' may be physically coupled to a pair of first guideways GW1 and may be laterally movable along the pair of first guideways GW1 between a first position (e.g., the source frame fix area) and a second position (e.g., the roller and FRM area) under the drive of a linear driving motor (not shown). The source frame stage 320/320' receives a source frame FR (with a processed wafer 100 thereon) from the frame transfer mechanism 632 and secures the source frame FR at the source frame fix area. Similarly, the target frame stage 330 may be physically coupled to a pair of second guideways GW2 and may be laterally movable along the pair of first guideways GW2 between a third position (e.g., the target frame fix area) and a fourth position (e.g., the roller and FRM area) under the drive of a linear driving motor (not shown). The target frame stage 330 receives a target frame FR' from the frame flipping tool 644 and secures the target frame FR' at the target frame fix area. After the source frame FR and the target frame FR' are installed, both the source frame stage 320/320' and the target frame stage 330 move to the roller and FRM area. Thereafter, the dies adhering process and the die-transfer process illustrated in FIGS. 4B to 4D are performed at the roller and FRM area, details of those processes have been described above and are not repeated here.

In addition, the roller RO may be coupled to a third guideway GW3 (which is parallel to the first guideways GW1 and second guideways GW2) and may be laterally movable along the third guideway GW3 between a fifth position and a sixth position under the drive of a linear driving motor (not shown), wherein the fifth position and the sixth position may be on opposite sides of the target frame FR mounted on the target frame stage 330 (at the roller and FRM area), so that the roller RO is allowed to move across the second tape TP' to perform the dies adhering process described above.

After the die-transfer (to the target frame FR') process is completed, the frame transfer mechanism 632 transfers the used source frame FR and used target frame FR' out of the die-transfer system 600 through the output frame load ports 622.

In summary, the embodiments of the present disclosure have some advantageous features. By using embodiments of die-transfer tools and methods as described above, wafer-level dies can be transferred simultaneously, thereby making the transfer of dies more efficient than the use of pick-and-place tools that pick and transfer a single die at a time. In addition, there is less die damage during the transfer of dies using the die-transfer tools and methods disclosed herein. Therefore, the die-transfer yield is also improved.

In accordance with some embodiments, a die-transfer tool is provided. The die-transfer tool includes a source frame stage, a target frame stage, a roller, and a driving mechanism. The source frame stage is configured to secure a first tape. The target frame stage is configured to secure a second tape, wherein the second tape has an adhesive surface facing the source frame stage when the second tape is mounted on the target frame stage. The roller is configured to move laterally over the non-adhesive surface of the second tape opposite the adhesive surface when a plurality of dies is between the first tape and the adhesive surface of the second tape. The driving mechanism is configured to vertically drive the target frame stage to adjust the relative position of the target frame stage above the source frame stage.

In accordance with some embodiments, a die-transfer method is provided. The die-transfer method includes attaching the frontside of a wafer to a first tape. The die-transfer method also includes performing a die sawing process to the backside of the wafer, wherein the die sawing process cut the wafer into a plurality of dies. The die-transfer method also includes providing a second tape over the first tape with an adhesive surface of the second tape facing the backsides of the dies. The die-transfer method also includes after the die sawing process, moving the second tape downward to a first position above backsides of the dies. The die-transfer method also includes applying a downward pressure from above the second tape so that the backsides of the dies contact and adhere to the second tape. In addition, the die-transfer method includes detaching the dies from the first tape by elevating the second tape to a second position higher than the first position.

In accordance with some embodiments, a die-transfer method is provided. The die-transfer method includes attaching the frontside of a wafer to a first tape. The die-transfer method also includes performing a die sawing process to the backside of the wafer, wherein the die sawing process cut the wafer into a plurality of dies. The die-transfer method also includes after the die sawing process, moving a second tape downward to a first position above backsides of the dies. The die-transfer method also includes pressing a portion of the second tape to a second position lower than the first position, wherein the portion of the second tape is in contact with the backsides of the dies. In addition, the die-transfer method includes detaching the dies from the first tape by elevating the second tape to a third position higher than the first position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die-transfer method, comprising:
attaching a frontside of a wafer to a first tape supported by a first frame;
performing a die sawing process to a backside of the wafer, wherein the die sawing process cut the wafer into a plurality of dies;
providing a second tape, supported by a second frame, over the first tape with an adhesive surface of the second tape facing backsides of the dies;
after the die sawing process, moving the second tape and the second frame downward to a first position above the backsides of the dies;
applying a downward pressure from above the second tape so that the backsides of the dies contact and adhere to the second tape;
detaching the dies from the first tape and transferring the dies to the second tape by elevating the second tape and the second frame to a second position higher than the first position, while keeping the first frame stationary; and
creating vacuum attraction from a top of the second tape while elevating the second tape.

2. The die-transfer method as claimed in claim 1, wherein applying the downward pressure from above the second tape comprises moving a roller over the second tape.

3. The die-transfer method as claimed in claim 1, further comprising:
flipping the second tape so that the adhesive surface of the second tape faces downward.

4. The die-transfer method as claimed in claim 1, wherein the second tape is elevated at a constant speed until all of the dies are transferred from the first tape to the second tape.

5. The die-transfer method as claimed in claim 1, wherein when transferring the dies, the dies are moved together with the second tape and the second frame, and the frontside of each of the dies, comprising a device layer, faces away from the moving second tape.

6. A die-transfer method, comprising:
attaching a frontside of a wafer to a first tape supported by a first frame;
performing a die sawing process to a backside of the wafer, wherein the die sawing process cut the wafer into a plurality of dies;
after the die sawing process, moving a second tape, supported by a second frame, downward to a first position above backsides of the dies;
pressing a portion of the second tape to a second position lower than the first position, wherein the portion of the second tape is in contact with the backsides of the dies;
detaching the dies from the first tape and transferring the dies to the second tape by elevating the second tape and the second frame to a third position higher than the first position, while keeping the first frame stationary; and
creating vacuum attraction from a top of the second tape while elevating the second tape.

7. The die-transfer method as claimed in claim 6, wherein after detaching the dies from the first tape, a plurality of non-die portions of the wafer remain on the first tape.

8. The die-transfer method as claimed in claim 6, further comprising:
creating vacuum attraction from a bottom of the first tape while elevating the second tape.

9. The die-transfer method as claimed in claim 6, further comprising:
forming first trenches on the frontside of the wafer prior to attaching the frontside of the wafer to the first tape, wherein the first trenches are formed in the wafer but do not penetrate the wafer, and
wherein the die sawing process forms second trenches on the backside of the wafer to connect the first trenches, so that the wafer is cut into the dies.

10. The die-transfer method as claimed in claim 6, wherein the second tape has greater adhesive strength than the first tape.

11. A die-transfer method, comprising:
attaching a frontside of a wafer to a first tape supported by a first frame;
performing a die sawing process to a backside of the wafer to cut the wafer into a plurality of dies and a plurality of non-die portions, wherein a thickness of the non-die portions is less than a thickness of the dies;
providing a second tape, supported by a second frame, over the first tape with an adhesive surface of the second tape facing backsides of the dies;
moving the second tape and the second frame downward to a first position above the backsides of the dies;
applying a downward pressure from above the second tape so that the backsides of the dies contact and adhere to the second tape;
elevating the second tape and the second frame to a second position higher than the first position, while keeping the first frame stationary, so that all the dies of the wafer are transferred from the first tape to the second tape; and
creating vacuum attraction from a top of the second tape while elevating the second tape.

12. The die-transfer method as claimed in claim 11, wherein when the backsides of the dies contact and adhere to the second tape, the non-die portions do not contact and adhere to the second tape.

13. The die-transfer method as claimed in claim 12, wherein after all the dies of the wafer are transferred from the first tape to the second tape, the non-die portions remain on the first tape.

14. The die-transfer method as claimed in claim 11, wherein the second tape is elevated at a constant speed until all of the dies are transferred from the first tape to the second tape.

15. The die-transfer method as claimed in claim 11, wherein the second tape has greater adhesive strength than the first tape.

16. The die-transfer method as claimed in claim 15, further comprising:
after performing the die sawing process, performing a curing process to the first tape to reduce the adhesive strength of the first tape.

17. The die-transfer method as claimed in claim 11, wherein applying the downward pressure from above the second tape comprises moving a roller over the second tape.

18. The die-transfer method as claimed in claim 11, further comprising:
forming first trenches on the frontside of the wafer prior to attaching the frontside of the wafer to the first tape, wherein the first trenches are formed in the wafer but do not penetrate the wafer, and
wherein the die sawing process comprises forming second trenches on the backside of the wafer to connect the first trenches, thereby cutting the wafer into the dies and the non-die portions.

19. The die-transfer method as claimed in claim 18, further comprising:

performing a thinning process to the backside of the wafer, after forming the first trenches and before performing the die sawing process.

20. The die-transfer method as claimed in claim 11, further comprising:

after performing the die sawing process, performing an expanding process to expand the first tape so that a distance between one of the plurality of dies and an adjacent non-die portion of the plurality of non-die portions is increased.

* * * * *